US012581831B2

(12) United States Patent
Imai et al.

(10) Patent No.: US 12,581,831 B2
(45) Date of Patent: Mar. 17, 2026

(54) DISPLAY DEVICE AND MANUFACTURING METHOD THEREOF

(71) Applicant: Magnolia White Corporation, Tokyo (JP)

(72) Inventors: Nobuo Imai, Tokyo (JP); Yuya Yamamoto, Tokyo (JP); Hiroshi Ogawa, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 363 days.

(21) Appl. No.: 18/327,904

(22) Filed: Jun. 2, 2023

(65) Prior Publication Data

US 2023/0413645 A1      Dec. 21, 2023

(30) Foreign Application Priority Data

Jun. 15, 2022      (JP) ................................. 2022-096622

(51) Int. Cl.
   *H10K 59/80*      (2023.01)
   *H10K 71/20*      (2023.01)
   *H10K 102/00*      (2023.01)

(52) U.S. Cl.
   CPC ......... H10K 59/871 (2023.02); H10K 71/233 (2023.02); *H10K 2102/351* (2023.02)

(58) Field of Classification Search
   CPC ........... H10K 59/871; H10K 59/80524; H10K 59/8731; H10K 59/352; H10K 59/122; H10K 71/233; H10K 2102/351
   See application file for complete search history.

(56) References Cited

U.S. PATENT DOCUMENTS

| | | |
|---|---|---|
| 2004/0160170 A1 | 8/2004 | Sato et al. |
| 2008/0303424 A1 | 12/2008 | Mitsuya et al. |
| 2009/0009069 A1 | 1/2009 | Takata |
| 2019/0363275 A1 | 11/2019 | Ochi et al. |
| 2022/0077251 A1* | 3/2022 | Choung ............... H10K 50/844 |

FOREIGN PATENT DOCUMENTS

| | | |
|---|---|---|
| JP | H11-329741 A | 11/1999 |
| JP | 2000-195677 A | 7/2000 |
| JP | 2004-207217 A | 7/2004 |
| JP | 2007-035484 A | 2/2007 |
| JP | 2007-073284 A | 3/2007 |
| JP | 2008-135325 A | 6/2008 |
| JP | 2008-270117 A | 11/2008 |
| JP | 2009-32673 A | 2/2009 |
| JP | 2010-118191 A | 5/2010 |
| WO | 2018/179308 A1 | 10/2018 |

* cited by examiner

*Primary Examiner* — James R Greece
*Assistant Examiner* — Jose M Diaz
(74) *Attorney, Agent, or Firm* — XSENSUS LLP

(57)      ABSTRACT

According to one embodiment, a display device includes a lower electrode, a rib including a pixel aperture, a partition including a lower portion on the rib and an upper portion protruding from a side surface of the lower portion, an upper electrode facing the lower electrode, an organic layer between the electrodes, and a sealing layer covering a display element and the partition. The rib includes a first rib layer and a second rib layer which covers the first rib layer. The sealing layer and the first rib layer are formed of a first inorganic material. The second rib layer is formed of a second inorganic material different from the first inorganic material.

20 Claims, 15 Drawing Sheets

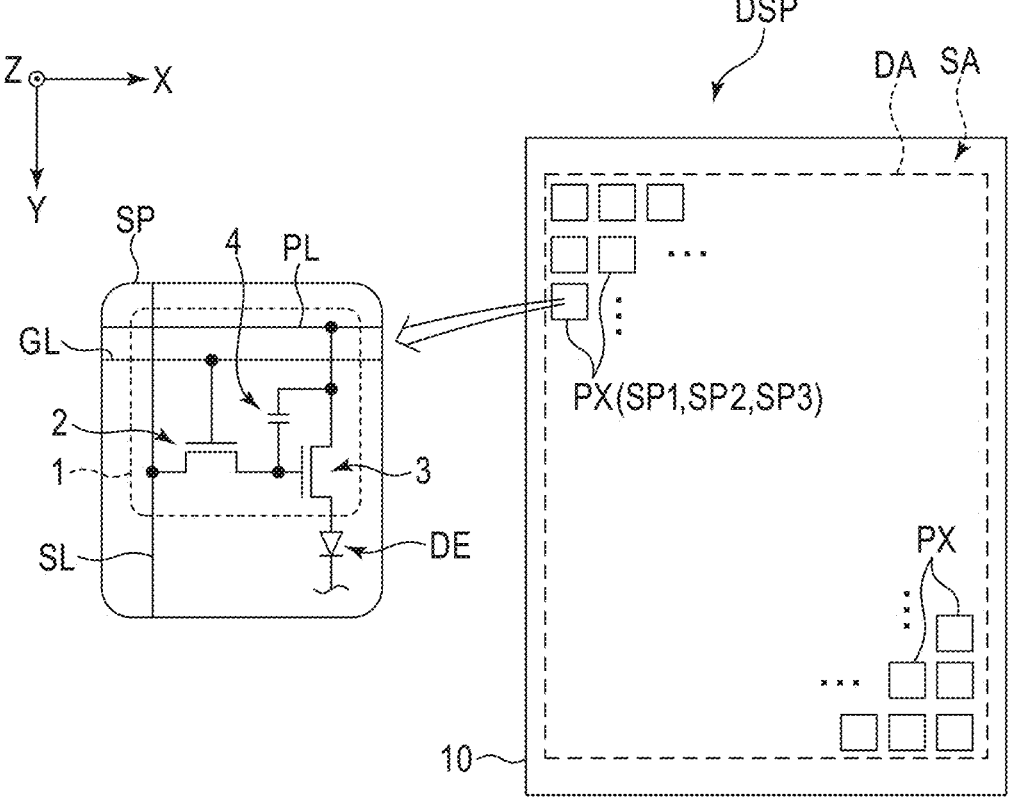
F I G. 1

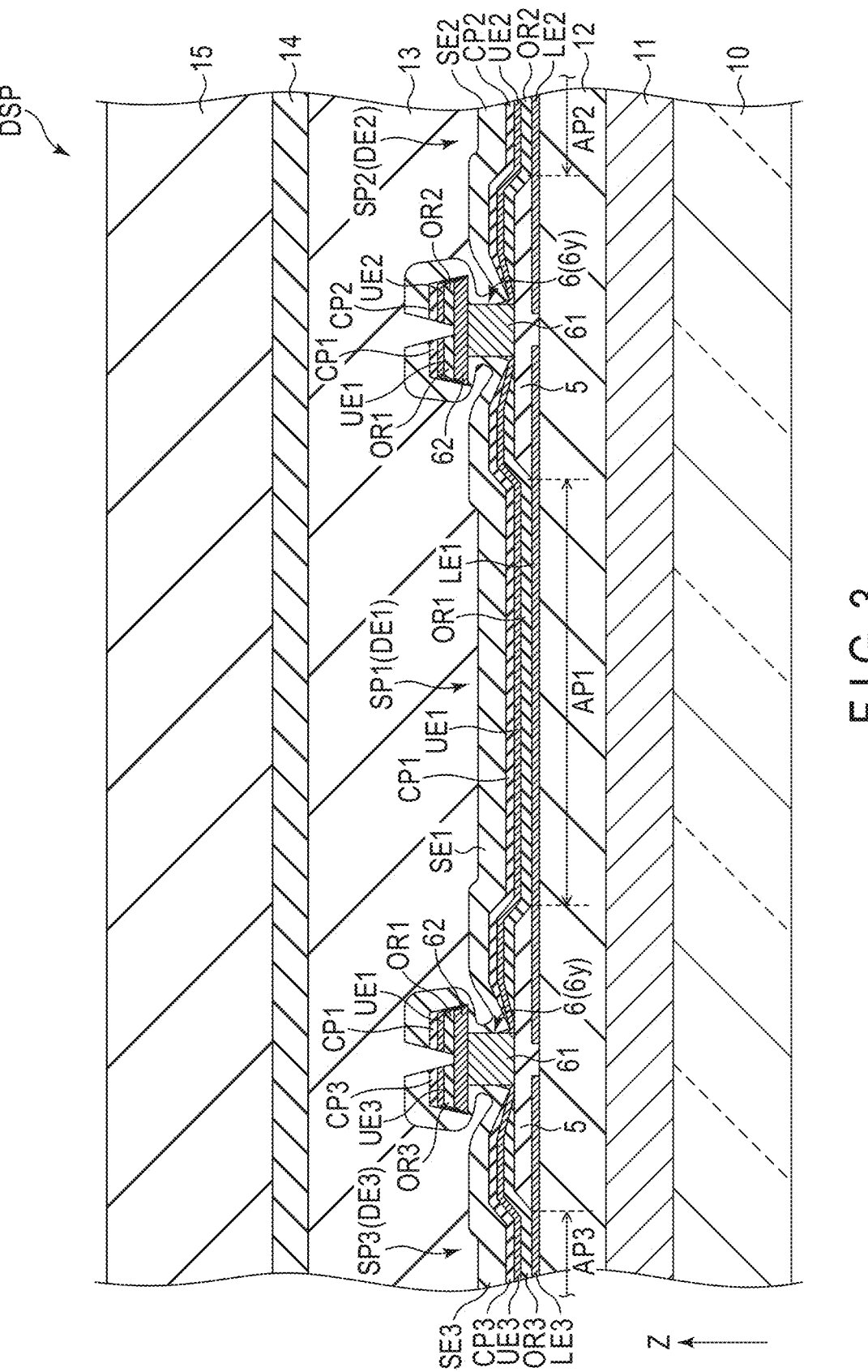
F I G. 3

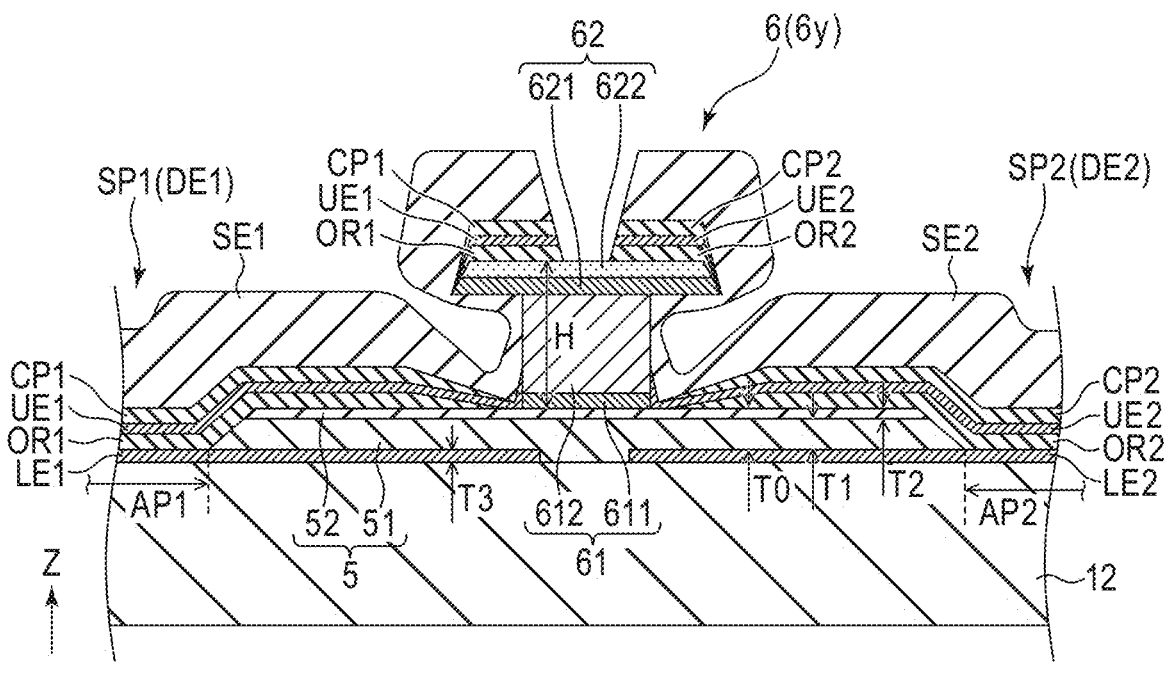
F I G. 4

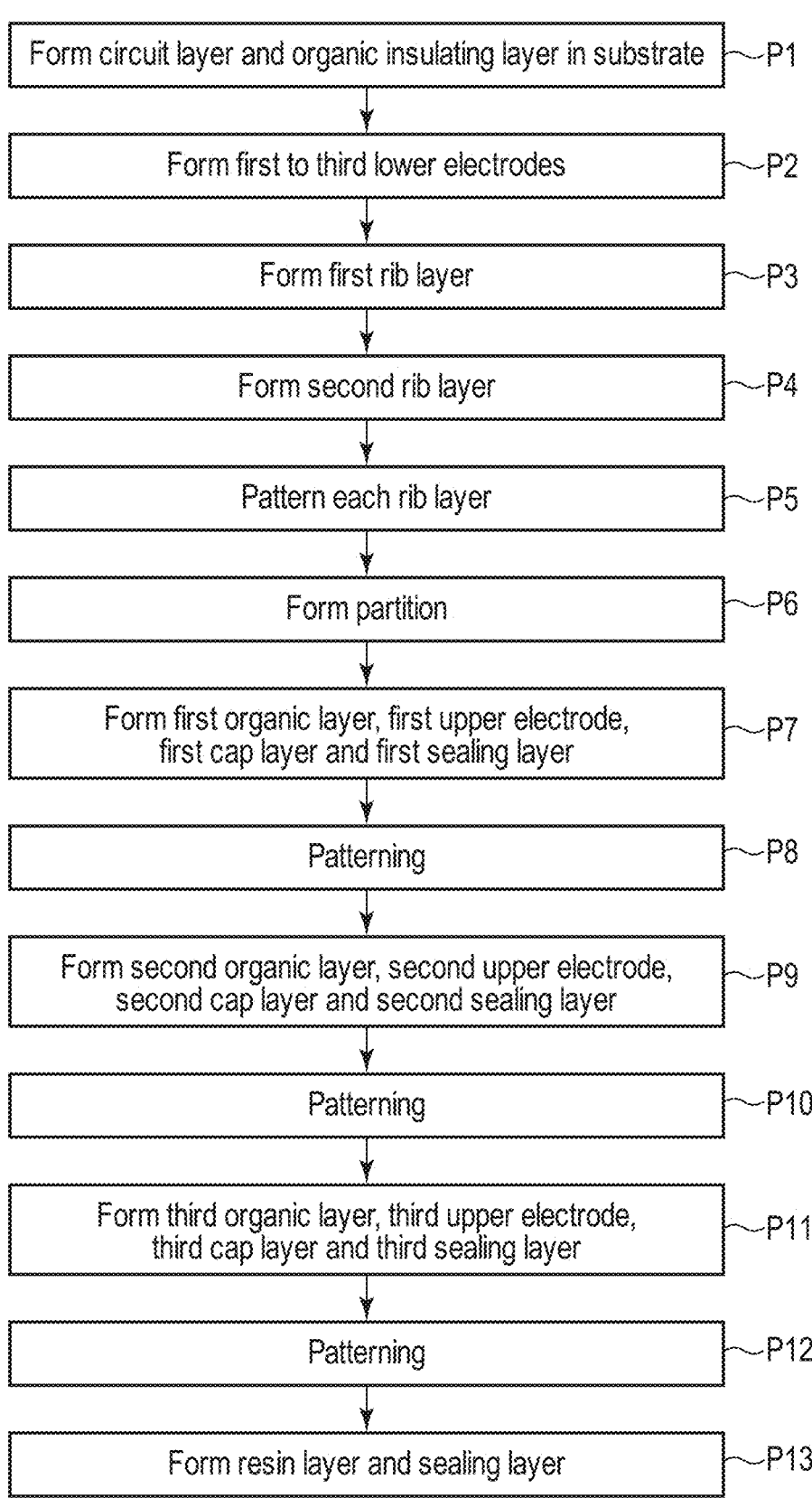

| Form circuit layer and organic insulating layer in substrate | P1 |
| Form first to third lower electrodes | P2 |
| Form first rib layer | P3 |
| Form second rib layer | P4 |
| Pattern each rib layer | P5 |
| Form partition | P6 |
| Form first organic layer, first upper electrode, first cap layer and first sealing layer | P7 |
| Patterning | P8 |
| Form second organic layer, second upper electrode, second cap layer and second sealing layer | P9 |
| Patterning | P10 |
| Form third organic layer, third upper electrode, third cap layer and third sealing layer | P11 |
| Patterning | P12 |
| Form resin layer and sealing layer | P13 |

F I G. 5

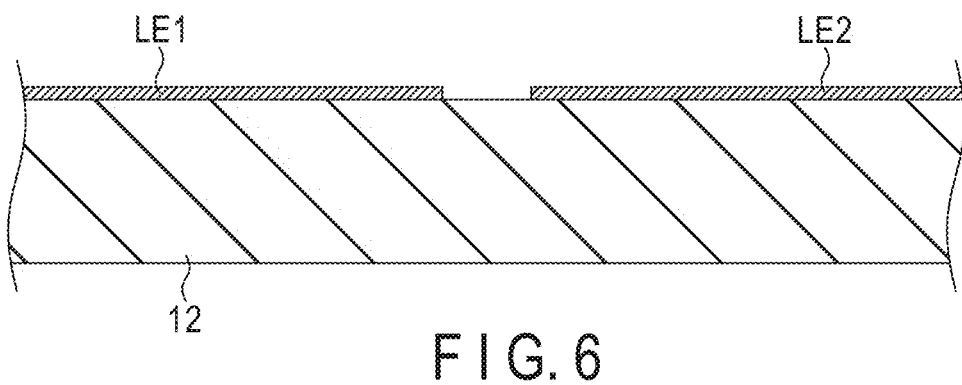
F I G. 6
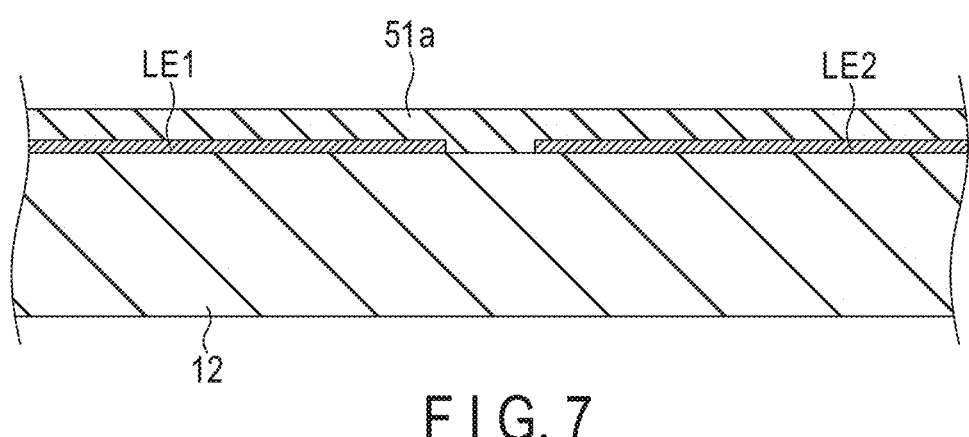
F I G. 7
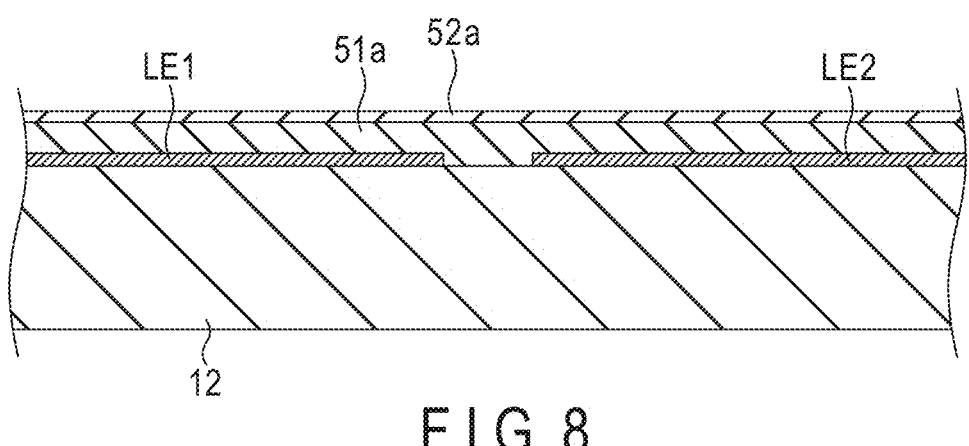
F I G. 8

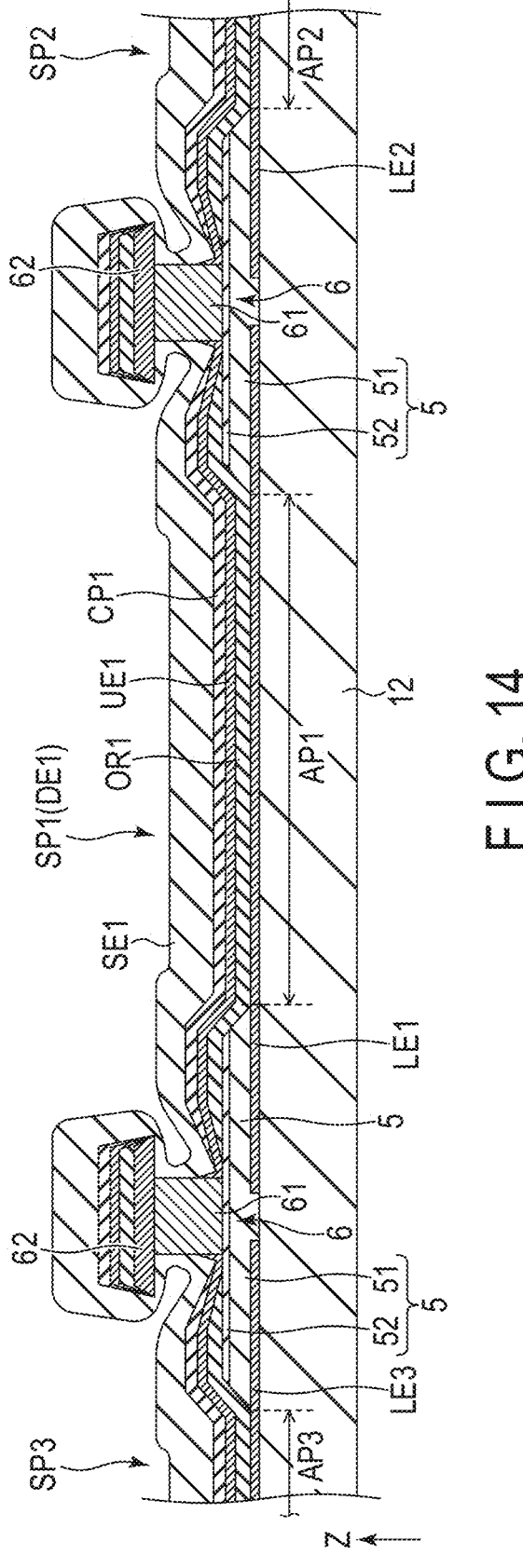
F I G. 14

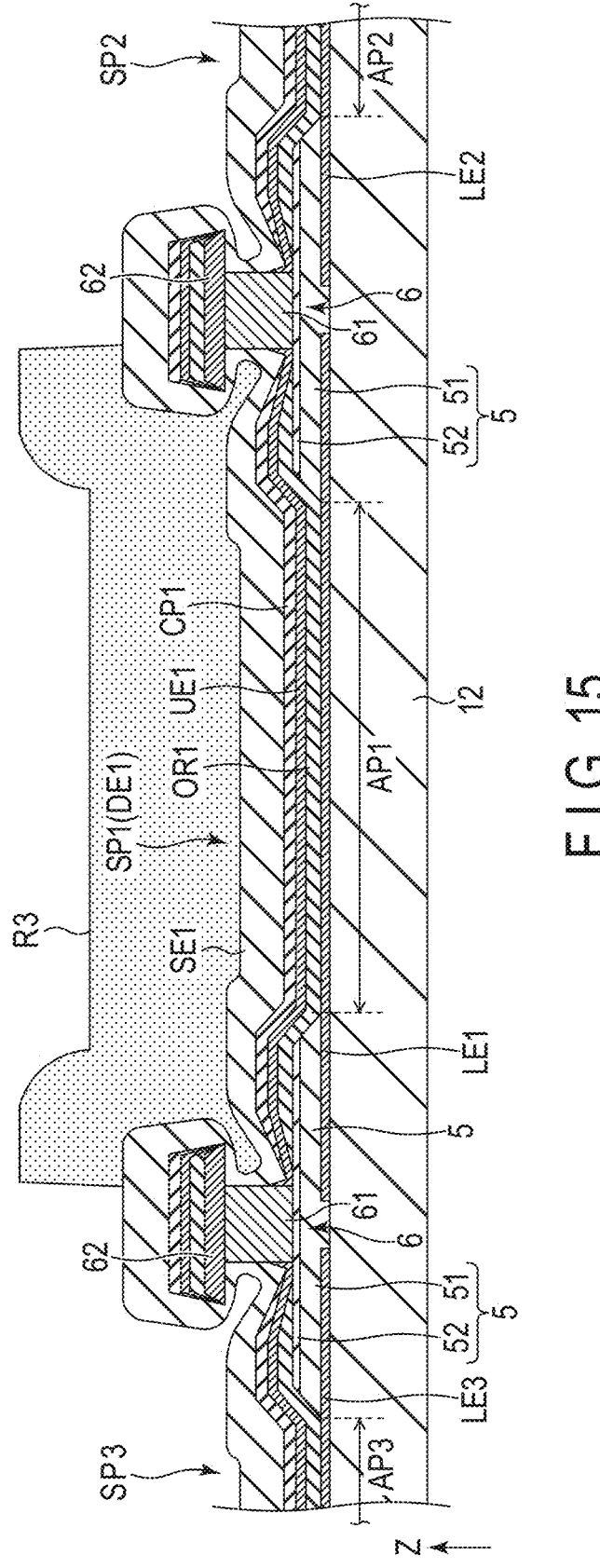
F I G. 15

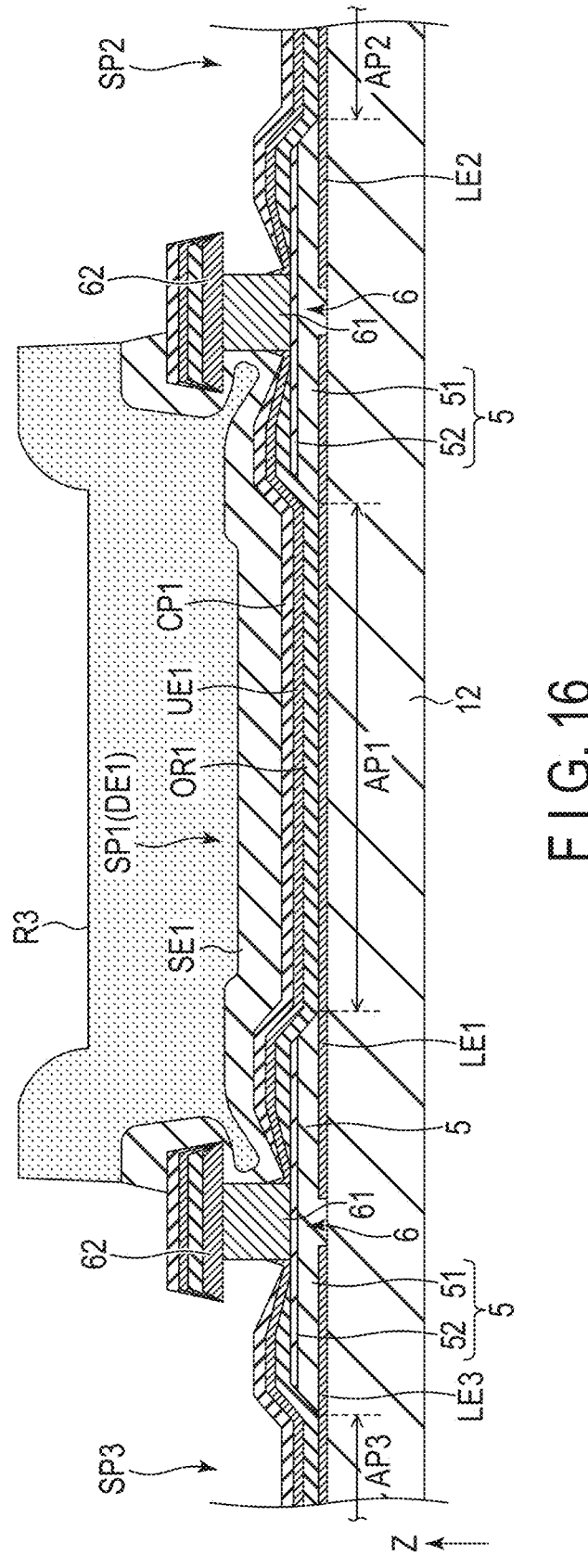
F I G. 16

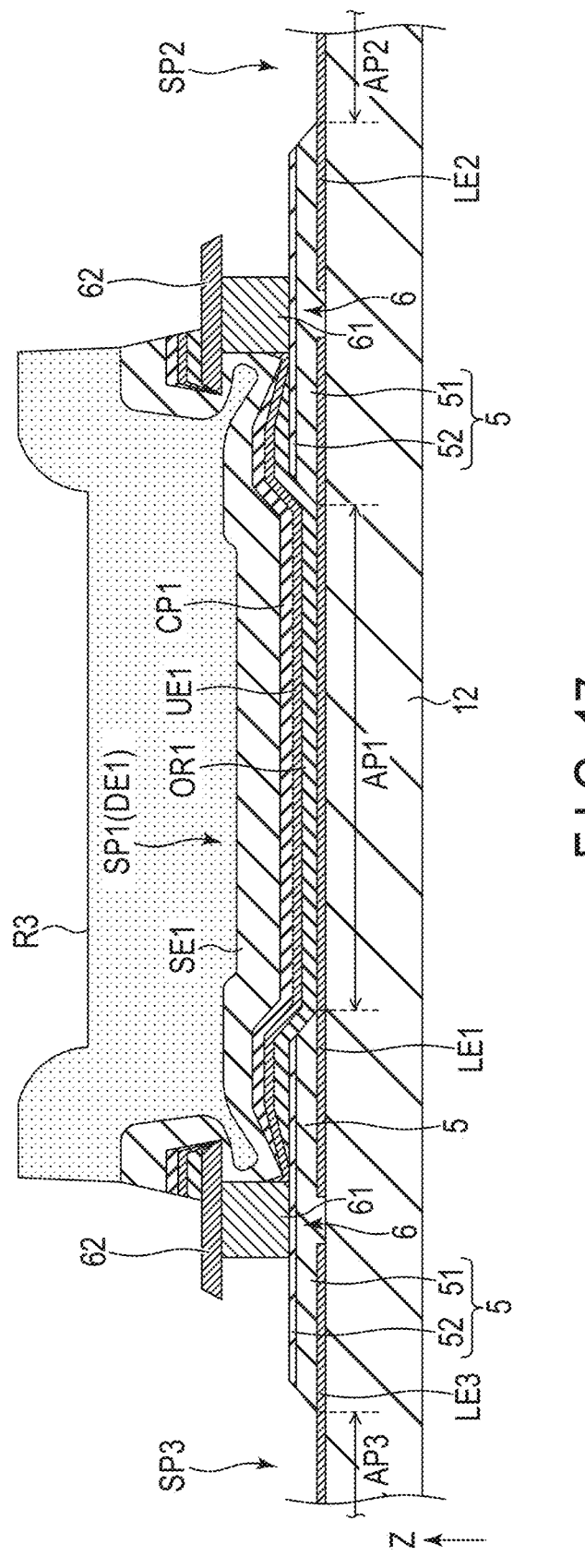
F I G. 17

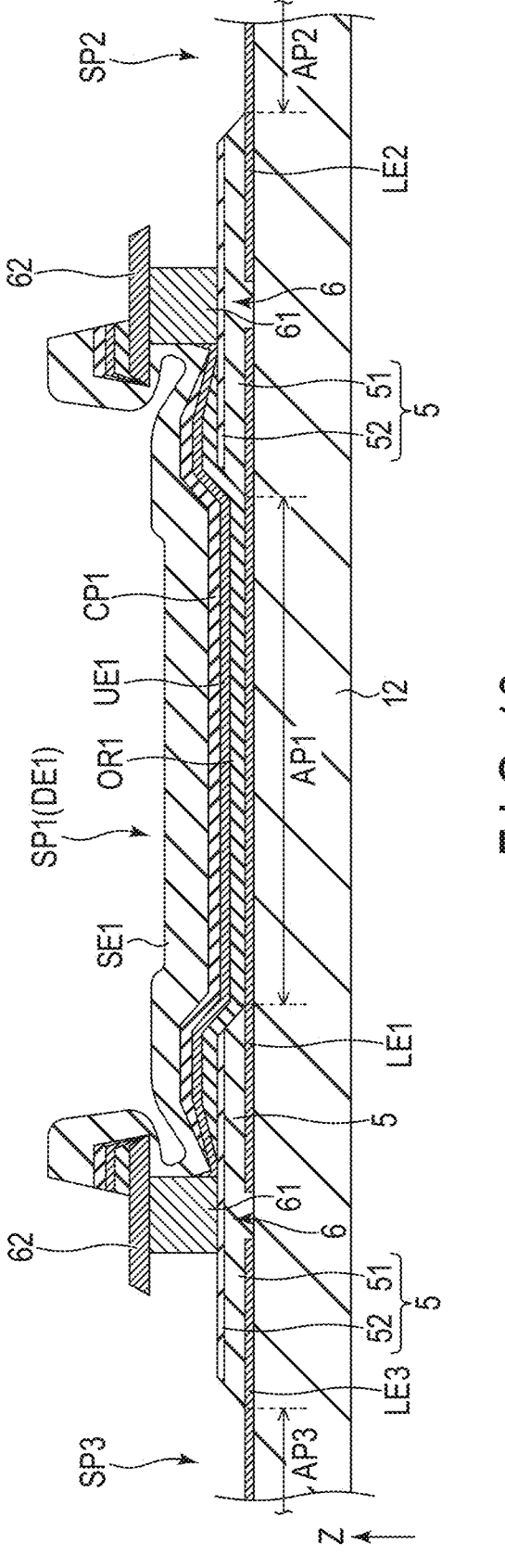
F I G. 18

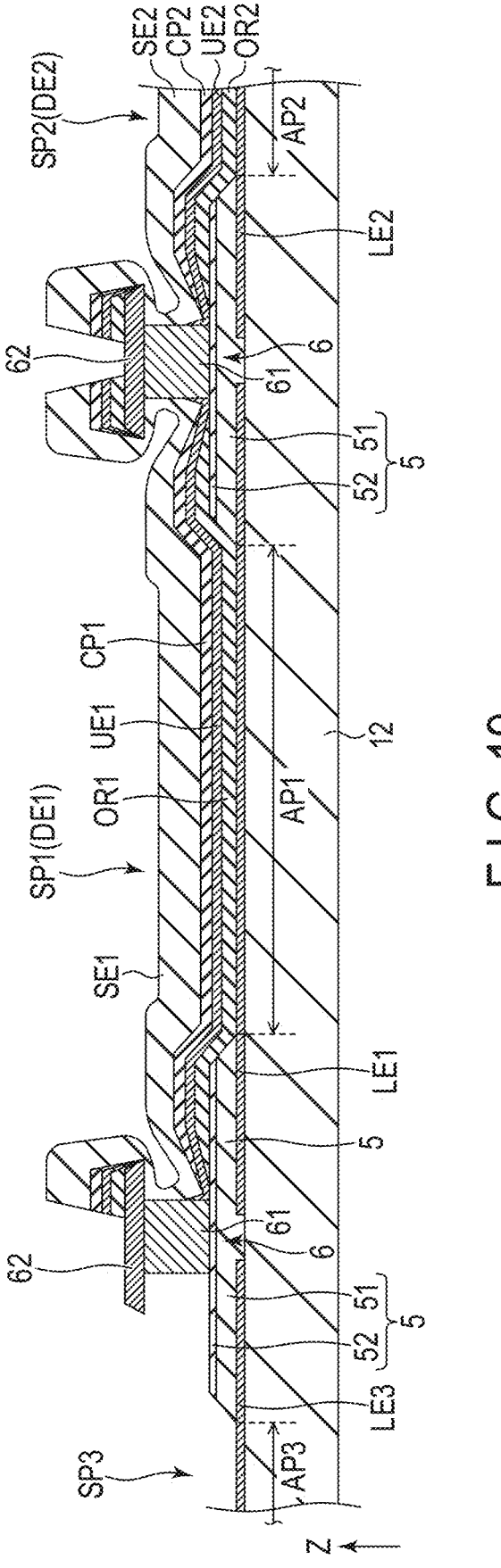
F I G. 19

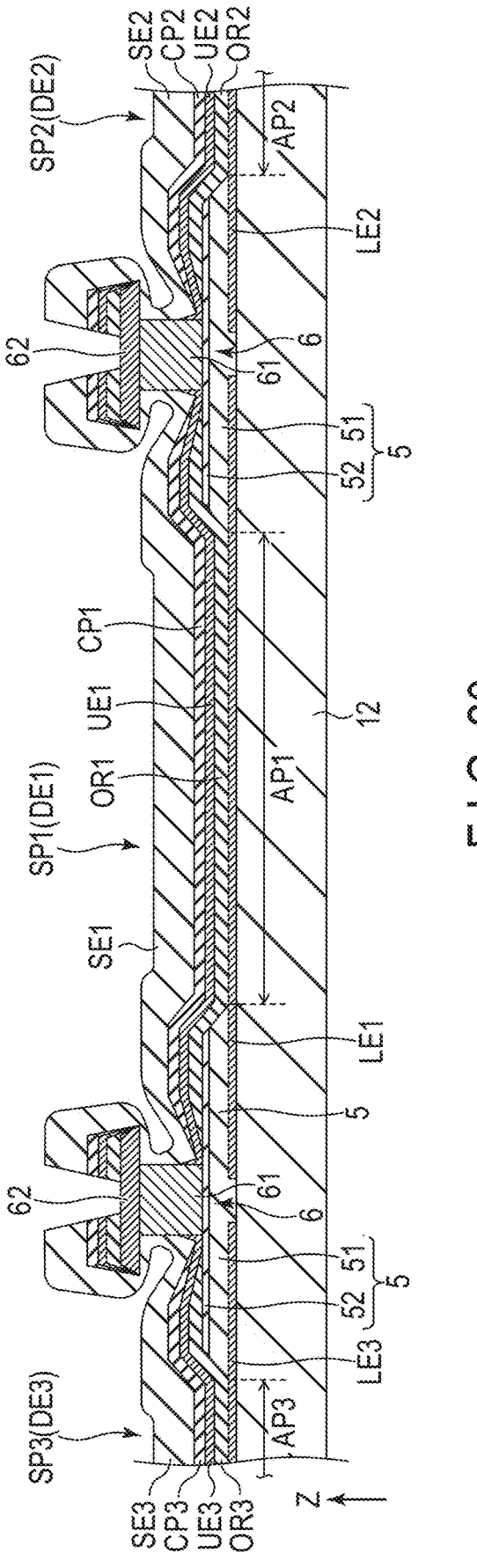
F I G. 20

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-096622, filed Jun. 15, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves reliability is required.

BRIEF DESCRIPTION OF THE DRAWINGS

FIG. 1 is a diagram showing a configuration example of a display device according to an embodiment.

FIG. 3 is a schematic cross-sectional view of the display device along the III-III line of FIG. 2.

FIG. 4 is a schematic cross-sectional view showing the structure of a partition located between a first subpixel and a second subpixel and its vicinity.

FIG. 5 is a flowchart showing an example of the manufacturing method of the display device according to the embodiment.

FIG. 6 is a schematic cross-sectional view showing part of the manufacturing process of the display device according to the embodiment.

FIG. 7 is a schematic cross-sectional view showing a manufacturing process following FIG. 6.

FIG. 8 is a schematic cross-sectional view showing a manufacturing process following FIG. 7.

FIG. 14 is a schematic cross-sectional view showing a manufacturing process following FIG. 13.

FIG. 15 is a schematic cross-sectional view showing a manufacturing process following FIG. 14.

FIG. 16 is a schematic cross-sectional view showing a manufacturing process following FIG. 15.

FIG. 17 is a schematic cross-sectional view showing a manufacturing process following FIG. 16.

FIG. 18 is a schematic cross-sectional view showing a manufacturing process following FIG. 17.

FIG. 19 is a schematic cross-sectional view showing a manufacturing process following FIG. 18.

FIG. 20 is a schematic cross-sectional view showing a manufacturing process following FIG. 19.

DETAILED DESCRIPTION

Figure 2:
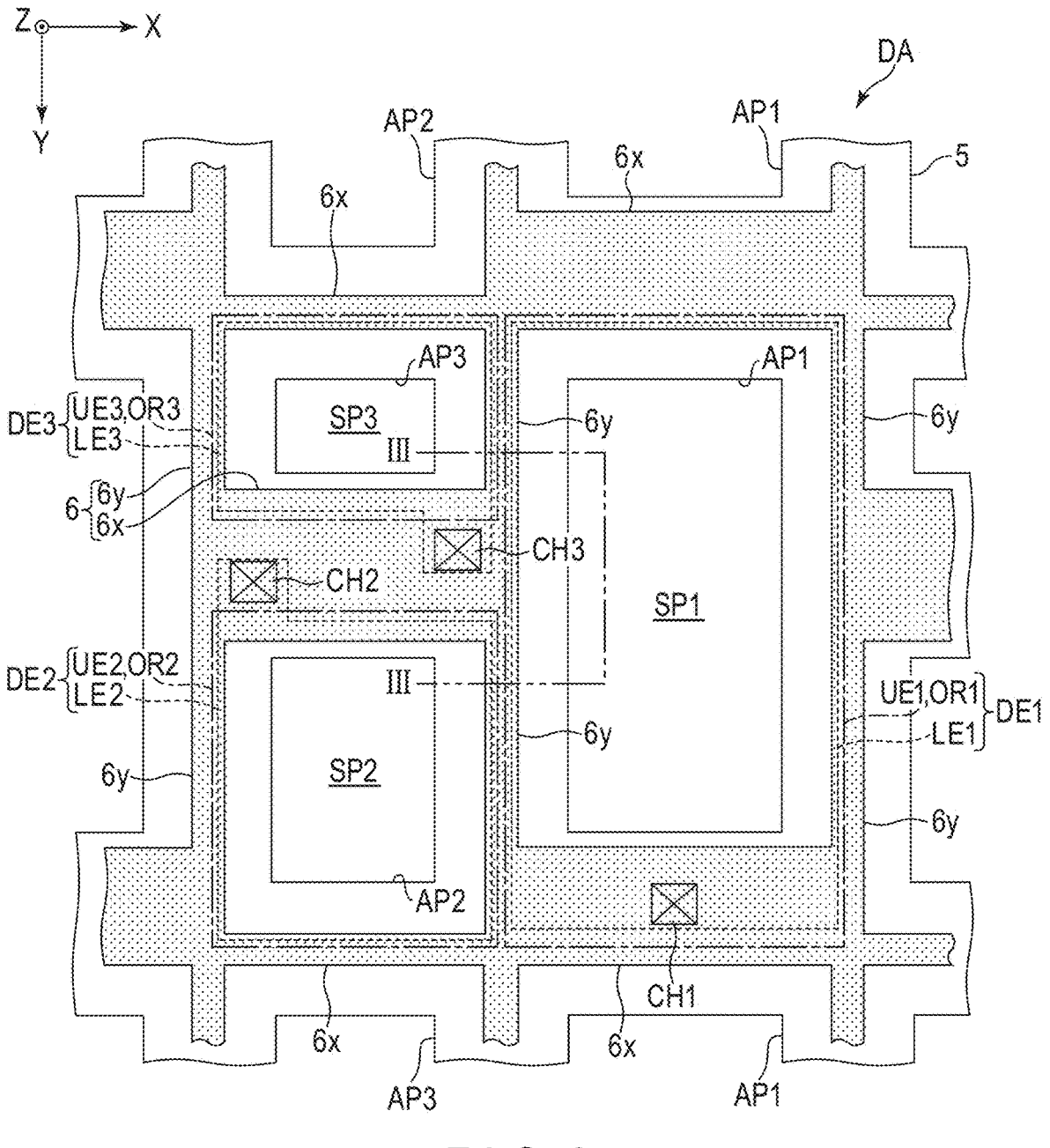
FIG. 2 is a diagram showing an example of the layout of subpixels.

In general, according to one embodiment, a display device comprises a lower electrode, a rib comprising a pixel aperture which overlaps the lower electrode, a partition comprising a lower portion provided on the rib and an upper portion which protrudes from a side surface of the lower portion, an upper electrode which faces the lower electrode, an organic layer which is located between the lower electrode and the upper electrode, is in contact with the lower electrode through the pixel aperture, and emits light based on a potential difference between the lower electrode and the upper electrode, and a sealing layer which continuously covers a display element including the lower electrode, the upper electrode and the organic layer and the partition. The rib includes a first rib layer and a second rib layer which covers the first rib layer. The sealing layer and the first rib layer are formed of a first inorganic material. The second rib layer is formed of a second inorganic material different from the first inorganic material.

According to another embodiment, a manufacturing method of a display device includes forming a lower electrode, forming a first rib layer which covers the lower electrode by a first inorganic material, forming a second rib layer which covers the first rib layer by a second inorganic material different from the first inorganic material, forming a rib comprising a pixel aperture which overlaps the lower electrode by patterning the first rib layer and the second rib layer, forming a partition comprising a lower portion provided on the rib and an upper portion which protrudes from a side surface of the lower portion, forming an organic layer which is in contact with the lower electrode through the pixel aperture, forming an upper electrode which covers the organic layer, and forming a sealing layer which covers a display element including the lower electrode, the upper electrode and the organic layer by the first inorganic material.

The embodiments can improve the reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue first subpixel SP1, a green second subpixel SP2 and a red third subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

FIG. 2 is a diagram showing an example of the layout of subpixels SP1, SP2 and SP3. In the example of FIG. 2, the first subpixel SP1 and the third subpixel SP3 are arranged in the first direction X. The first subpixel SP1 and the second subpixel SP2 are also arranged in the first direction X. Further, the second subpixel SP2 and the third subpixel SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of first subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a first pixel aperture AP1 in the first subpixel SP1, comprises a second pixel aperture AP2 in the second subpixel SP2 and comprises a third pixel aperture AP3 in the third subpixel SP3.

In the example of FIG. 2, the area of the first pixel aperture AP1 is greater than that of the second pixel aperture AP2. The area of the first pixel aperture AP1 is greater than that of the third pixel aperture AP3. Further, the area of the third pixel aperture AP3 is less than that of the second pixel aperture AP2.

The partition 6 is provided in the boundary between adjacent subpixels SP and overlaps the rib 5 as seen in plan view. The partition 6 comprises a plurality of first partitions 6$x$ extending in the first direction X and a plurality of second partitions 6$y$ extending in the second direction Y. The first partitions 6$x$ are provided between the pixel apertures AP2 and AP3 which are adjacent to each other in the second direction Y and between two first pixel apertures AP1 which are adjacent to each other in the second direction Y. Each second partition 6$y$ is provided between the pixel apertures AP1 and AP2 which are adjacent to each other in the first direction X and between the pixel apertures AP1 and AP3 which are adjacent to each other in the first direction X.

In the example of FIG. 2, the first partitions 6$x$ and the second partitions 6$y$ are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

The first subpixel SP1 comprises a first lower electrode LE1, a first upper electrode UE1 and a first organic layer OR1 overlapping the first pixel aperture AP1. The second subpixel SP2 comprises a second lower electrode LE2, a second upper electrode UE2 and a second organic layer OR2 overlapping the second pixel aperture AP2. The third subpixel SP3 comprises a third lower electrode LE3, a third upper electrode UE3 and a third organic layer OR3 overlapping the third pixel aperture AP3.

The first lower electrode LE1, the first upper electrode UE1 and the first organic layer OR1 constitute the first display element DE1 of the first subpixel SP1. The second lower electrode LE2, the second upper electrode UE2 and the second organic layer OR2 constitute the second display element DE2 of the second subpixel SP2. The third lower electrode LE3, the third upper electrode UE3 and the third organic layer OR3 constitute the third display element DE3 of the third subpixel SP3. Each of the display elements DE1, DE2 and DE3 may include a cap layer (optical adjustment layer) as described later.

The first lower electrode LE1 is connected to the pixel circuit 1 (see FIG. 1) of the first subpixel SP1 through a first contact hole CH1. The second lower electrode LE2 is connected to the pixel circuit 1 of the second subpixel SP2 through a second contact hole CH2. The third lower electrode LE3 is connected to the pixel circuit 1 of the third subpixel SP3 through a third contact hole CH3.

In the example of FIG. 2, the contact holes CH2 and CH3 entirely overlap the first partition 6X between the pixel apertures AP2 and AP3 which are adjacent to each other in the second direction Y. The first contact hole CH1 entirely overlaps the first partition 6$x$ between two first pixel apertures AP1 which are adjacent to each other in the second direction Y. As another example, at least part of the contact hole CH1, CH2 or CH3 may not overlap the first partition 6x.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The first organic layer OR1 covers the first lower electrode LE1 through the first pixel aperture AP1. The first upper electrode UE1 covers the first organic layer OR1 and faces the first lower electrode LE1. The second organic layer OR2 covers the second lower electrode LE2 through the second pixel aperture AP2. The second upper electrode UE2 covers the second organic layer OR2 and faces the second lower electrode LE2. The third organic layer OR3 covers the third lower electrode LE3 through the third pixel aperture AP3. The third upper electrode UE3 covers the third organic layer OR3 and faces the third lower electrode LE3.

In the example of FIG. 3, a first cap layer CP1 is provided on the first upper electrode UE1. A second cap layer CP2 is provided on the second upper electrode UE2. A third cap layer CP3 is provided on the third upper electrode UE3. The cap layers CP1, CP2 and CP3 adjust the optical property of the light emitted from the organic layers OR1, OR2 and OR3, respectively.

A first sealing layer SE1 is provided in the first subpixel SP1. A second sealing layer SE2 is provided in the second subpixel SP2. A third sealing layer SE3 is provided in the third subpixel SP3. The first sealing layer SE1 continuously covers the first cap layer CP1 and the partition 6 around the first subpixel SP1. The second sealing layer SE2 continuously covers the second cap layer CP2 and the partition 6 around the second subpixel SP2. The third sealing layer SE3 continuously covers the third cap layer CP3 and the partition 6 around the third subpixel SP3.

The end portions (peripheral portions) of the sealing layers SE1, SE2 and SE3 are located above the upper portions 62. In the example of FIG. 3, the end portions of the sealing layers SE1 and SE2 located above the upper portion 62 of the partition 6 between subpixels SP1 and SP2 are spaced apart from each other. The end portions of the sealing layers SE1 and SE3 located above the upper portion 62 of the partition 6 between subpixels SP1 and SP3 are spaced apart from each other.

The sealing layers SE1, SE2 and SE3 are covered with a resin layer 13. The resin layer 13 is covered with a sealing layer 14. Further, the sealing layer 14 is covered with a resin layer 15.

Each of the organic insulating layer 12 and the resin layers 13 and 15 is formed of an organic material. The sealing layer 14 is formed of, for example, an inorganic material such as silicon nitride (SiNx), silicon oxide (SiOx) or silicon oxynitride (SiON). Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer.

Each of the cap layers CP1, CP2 and CP3 is formed of, for example, a multilayer body consisting of a plurality of transparent thin films. As the thin films, the multilayer body may include a thin film formed of an inorganic material and a thin film formed of an organic material. These thin films have refractive indices different from each other. The materials of the thin films constituting the multilayer body are different from those of the upper electrodes UE1, UE2 and UE3 and are also different from those of the sealing layers SE1, SE2 and SE3. It should be noted that the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the first lower electrode LE1 and the first upper electrode UE1, the light emitting layer of the first organic layer OR1 emits light in a blue wavelength range. When a potential difference is formed between the second lower electrode LE2 and the second upper electrode UE2, the light emitting layer of the second organic layer OR2 emits light in a green wavelength range. When a potential difference is formed between the third lower electrode LE3 and the third upper electrode UE3, the light emitting layer of the third organic layer OR3 emits light in a red wavelength range.

FIG. 4 is a schematic cross-sectional view showing the structure of the partition 6 located between the first subpixel SP1 and the second subpixel SP2 and its vicinity. The structures of the partition 6 between the first subpixel SP1 and the third subpixel SP3 and its vicinity and the partition 6 between the second subpixel SP2 and the third subpixel SP3 and its vicinity are similar to the structure of the example of FIG. 4.

The rib 5 includes a first rib layer 51 and a second rib layer 52. The first rib layer 51 covers end portions of the lower electrodes LE1 and LE2. The second rib layer 52 covers the first rib layer 51.

The end portion of the rib 5 defining the pixel apertures AP1, AP2 and AP3 is formed into a taper shape in which the thickness is gradually decreased. In the end portion, the first rib layer 51 protrudes relative to the second rib layer 52.

The lower portion 61 of the partition 6 includes a first metal layer 611 and a second metal layer 612. The first metal layer 611 is provided on the second rib layer 52. The second metal layer 612 is formed so as to be thicker than the first metal layer 611 and is provided on the first metal layer 611.

The upper portion 62 of the partition 6 includes a first thin film 621 and a second thin film 622. The first thin film 621 is provided on the second metal layer 612. The second thin film 622 covers the first thin film 621.

Each of the first rib layer 51 and the sealing layers SE1, SE2 and SE3 is formed of a first inorganic material. The second rib layer 52 is formed of a second inorganic material different from the first inorganic material.

In the present embodiment, the first inorganic material is assumed to be silicon nitride. In this case, for the second inorganic material, silicon oxide or silicon oxynitride can be used.

The first metal layer 611 is formed of, for example, molybdenum (Mo). The second metal layer 612 is formed of, for example, aluminum (Al). The second metal layer 612 may be formed of an aluminum alloy such as an aluminum-neodymium alloy (AlNd) or may comprise a multilayer structure consisting of an aluminum layer and an aluminum alloy layer. The lower portion 61 may not include the first metal layer 611.

The first thin film 621 is formed of, for example, a metal material such as titanium (Ti). The second thin film 622 is formed of, for example, a conductive oxide such as ITO. The upper portion 62 may not include the second thin film 622.

Here, the height of the partition 6 including the lower portion 61 and the upper portion 62 is defined as H. The thickness of the rib 5 including the first rib layer 51 and the second rib layer 52 is defined as T0. The thickness of the first rib layer 51 is defined as T1. The thickness of the second rib layer 52 is defined as T2. The thickness of each of the lower electrodes LE1, LE2 and LE3 is defined as T3. For example, thicknesses T0, T1 and T2 are the thicknesses of, of the rib 5, respectively, the first rib layer 51 and the second rib layer 52, respectively, the portions located above the lower electrodes LE1, LE2 and LE3.

In the present embodiment, thickness T0 is less than height H (T0<H). Thickness T0 is greater than or equal to 1.5 times thickness T3 and less than or equal to 5 times thickness T3 ($1.5 \times T3 \leq T0 \leq 5 \times T3$). For example, thickness T0 is greater than or equal to 200 nm and less than or equal to 600 nm (200 nm≤T0≤600 nm).

Further, in the present embodiment, thickness T2 is less than thickness T1 (T2<T1). For example, thickness T2 is less than or equal to half thickness T1. For example, thickness T2 is greater than or equal to 50 nm and less than or equal to 100 nm (50 nm≤T2≤100 nm).

Now, this specification explains the manufacturing method of the display device DSP.

FIG. 5 is a flowchart showing an example of the manufacturing method of the display device DSP. Each of FIG. 6 to FIG. 20 is a schematic cross-sectional view showing a part of the manufacturing process of the display device DSP. In FIG. 6 to FIG. 20, the substrate 10 and the circuit layer 11 are omitted.

To manufacture the display device DSP, first, the circuit layer 11 and the organic insulating layer 12 are formed on the substrate 10 (process P1).

After process P1, as shown in FIG. 6, the lower electrodes LE1, LE2 and LE3 are formed on the organic insulating layer 12 (process P2).

After process P2, as shown in FIG. 7, a first rib layer 51a which covers the lower electrodes LE1, LE2 and LE3 is formed by the first inorganic material (process P3). Further, as shown in FIG. 8, a second rib layer 52a which covers the first rib layer 51a is formed by the second inorganic material (process P4).

Figure 9:
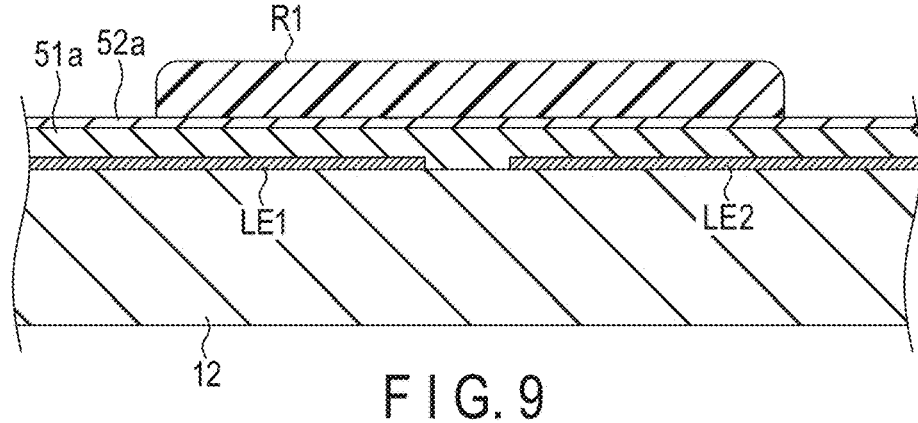
FIG. 9 is a schematic cross-sectional view showing a manufacturing process following FIG. 8.

After process P4, the first rib layer 51a and the second rib layer 52a are patterned (process P5). Specifically, as shown in FIG. 9, a resist R1 is provided on the second rib layer 52a. The resist R1 has a planar shape similar to that of the rib 5 shown in FIG. 2.

Figure 10:
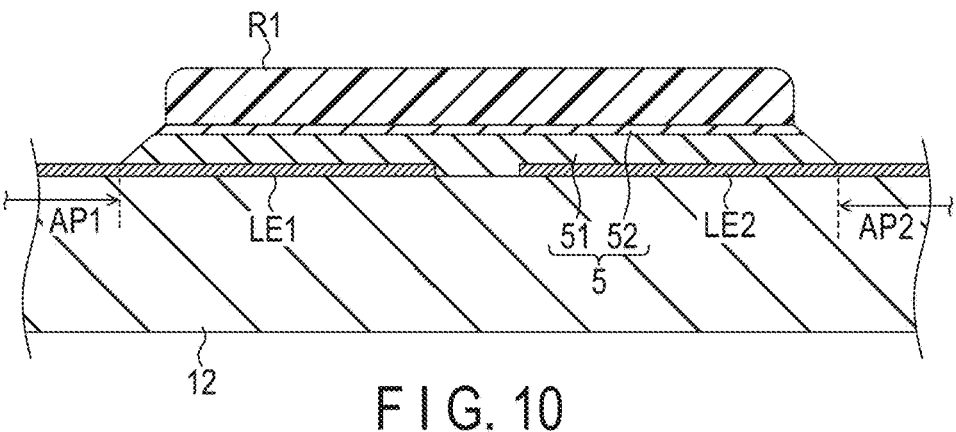
FIG. 10 is a schematic cross-sectional view showing a manufacturing process following FIG. 9.

After the formation of the resist R1, as shown in FIG. 10, of the first rib layer 51a and the second rib layer 52a, the portions exposed from the resist R1 are removed by dry etching using the resist R1 as a mask. By this process, the pixel apertures AP1, AP2 and AP3 are formed, and the rib 5 including the first rib layer 51 and the second rib layer 52 is obtained.

Figure 11:
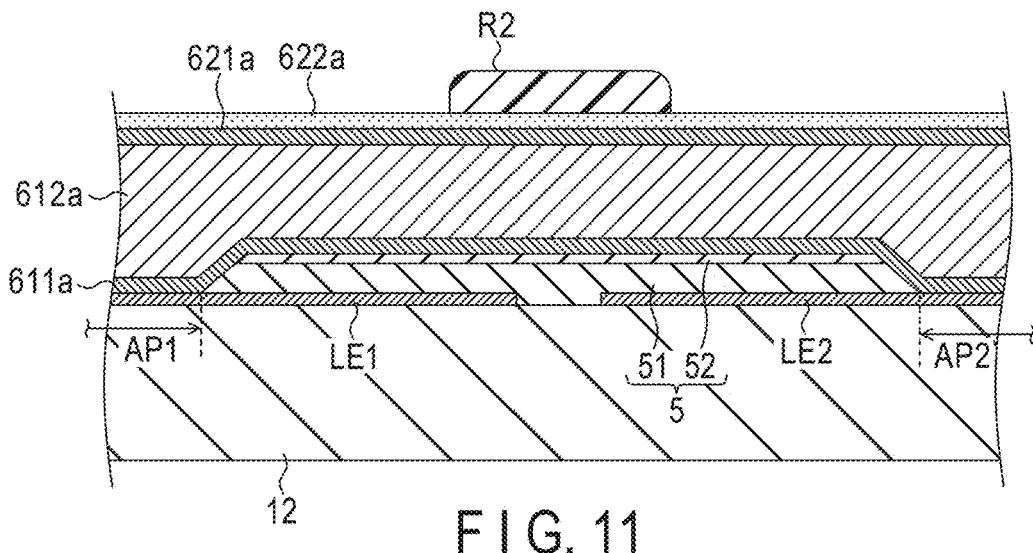
FIG. 11 is a schematic cross-sectional view showing a manufacturing process following FIG. 10.

After process P5, the resist R1 is removed and the partition 6 is formed on the rib 5 (process P6). In process P6, as shown in FIG. 11, a first metal layer 611a which covers the rib 5, a second metal layer 612a which covers the first metal layer 611a, a first thin film 621a which covers the second metal layer 612a and a second thin film 622a which covers the first thin film 621a are formed in order. Further, a resist R2 is provided on the second thin film 622a. The resist R2 has a planar shape similar to that of the partition 6 shown in FIG. 2.

Figure 12:
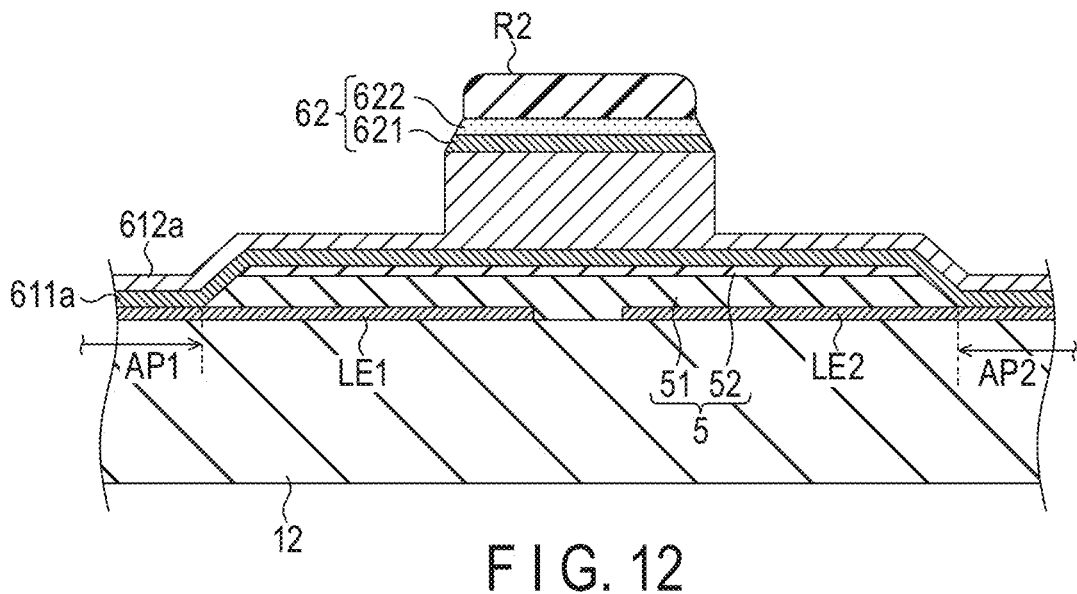
FIG. 12 is a schematic cross-sectional view showing a manufacturing process following FIG. 11.

Subsequently, as shown in FIG. 12, of the second thin film 622a, the portion exposed from the resist R2 is removed by wet etching using the resist R2 as a mask. Further, as shown in FIG. 12, of the first thin film 621a, the portion exposed from the resist R2 is removed by anisotropic dry etching using the resist R2 as a mask. By this process, the upper portion 62 including the first thin film 621 and the second thin film 622 is formed. In the anisotropic dry etching described above, of the second metal layer 612a, the thickness of the portion exposed from the resist R2 is also reduced.

Figure 13:
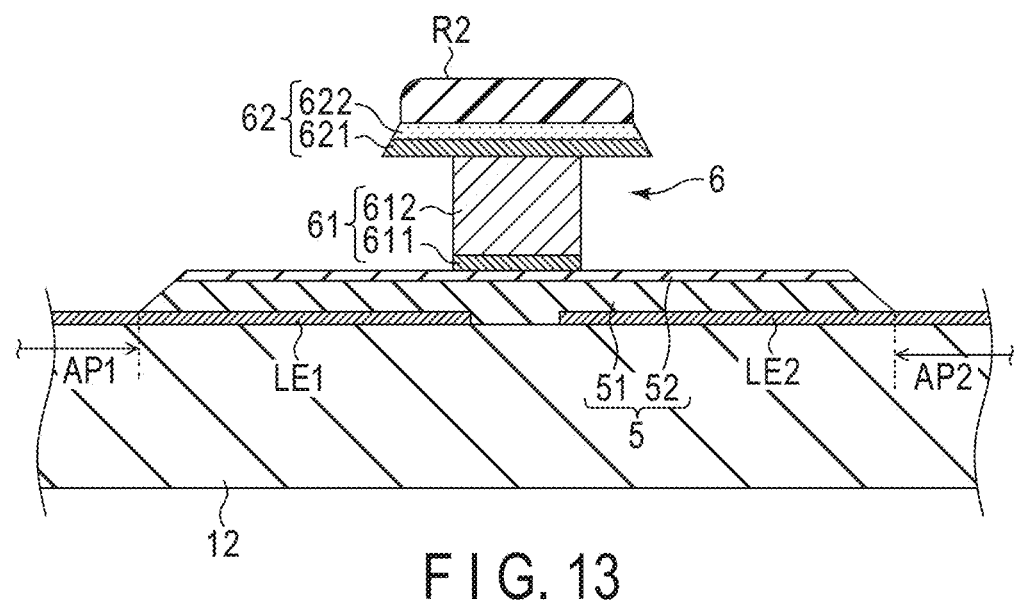
FIG. 13 is a schematic cross-sectional view showing a manufacturing process following FIG. 12.

Subsequently, isotropic wet etching is applied. By this process, as shown in FIG. 13, of the second metal layer 612a, the portion in which the thickness is reduced and the first metal layer 611a under this portion are removed. In this way, the lower portion 61 including the first metal layer 611 and the second metal layer 612 is formed. In this isotropic wet etching, the side surfaces of the first metal layer 611 and the second metal layer 612 also corrode. Thus, the width of the lower portion 61 is made less than that of the upper portion 62, thereby obtaining the partition 6 having an overhang shape. After the partition 6 is formed in this manner, the resist R2 is removed.

In the above explanation, this specification exemplarily shows a case where the partition 6 is formed after the pixel apertures AP1, AP2 and AP3 are formed in the rib 5 in process P5. As another example, the pixel apertures AP1, AP2 and AP3 may be formed after the partition 6 is formed.

After process P6, as shown in FIG. 14, the first organic layer OR1 which is in contact with the first lower electrode LE1 through the first pixel aperture AP1, the first upper electrode UE1 which covers the first organic layer OR1 and the first cap layer CP1 which covers the first upper electrode UE1 are formed in order by vapor deposition. Further, by chemical vapor deposition (CVD), the first sealing layer SE1 which continuously covers the first cap layer CP1 and the partition 6 is formed (process P7). The first sealing layer SE1 is formed of the first inorganic material described above.

These first organic layer OR1, first upper electrode UE1, first cap layer CP1 and first sealing layer SE1 are formed in at least the entire display area DA and are provided in the second subpixel SP2 and the third subpixel SP3 in addition to the first subpixel SP1. The first organic layer OR1, the first upper electrode UE1 and the first cap layer CP1 are divided by the partition 6 having an overhang shape.

After process P7, the first organic layer OR1, the first upper electrode UE1, the first cap layer CP1 and the first sealing layer SE1 are patterned (process P8). Specifically, as shown in FIG. 15, a resist R3 is provided on the first sealing layer SE1. The resist R3 covers the first subpixel SP1 and a part of the partition 6 around the first subpixel SP1.

Subsequently, as shown in FIG. 16, of the first sealing layer SE1, the portion exposed from the resist R3 is removed by dry etching using the resist R3 as a mask. Specifically, of the first sealing layer SE1, the portion located above the first lower electrode LE1 remains. The remaining first sealing layer SE1 is partly located on the partition 6 surrounding the first subpixel SP1. Of the first sealing layer SE1 which is located on the partition 6 before the dry etching, the portions which are close to subpixels SP2 and SP3 are removed.

For example, for the dry etching, an etching gas containing fluorine is used. For the etching gas, for example, sulfur hexafluoride ($SF_6$), tetrafluoromethane ($CF_4$), hexafluoroethane ($C_2F_6$), trifluoromethane ($CHF_3$) or nitrogen trifluoride ($NF_3$) may be used. The first cap layer CP1 and the first upper electrode UE1 function as the etching stoppers of the dry etching.

Subsequently, as shown in FIG. 17, of the first organic layer OR1, the first upper electrode UE1 and the first cap layer CP1, the portions exposed from the resist R3 are removed by etching using the resist R3 as a mask. For example, this etching includes wet etching or ashing for the first cap layer CP1, wet etching for the first upper electrode UE1 and ashing for the first organic layer OR1.

Subsequently, the resist R3 is removed. This process allows the acquisition of the substrate shown in FIG. 18, in which the first display element DE1 and the first sealing layer SE1 are formed in the first subpixel SP1, and neither a display element nor a sealing layer is formed in the second subpixel SP2 or the third subpixel SP3.

After process P8, the second organic layer OR2 which is in contact with the second lower electrode LE2 through the second pixel aperture AP2, the second upper electrode UE2 which covers the second organic layer OR2 and the second cap layer CP2 which covers the second upper electrode UE2 are formed in order by vapor deposition. Further, the second sealing layer SE2 which continuously covers the second cap layer CP2 and the partition 6 is formed by CVD (process P9).

These second organic layer OR2, second upper electrode UE2, second cap layer CP2 and second sealing layer SE2 are formed in at least the entire display area DA and are provided in the first subpixel SP1 and the third subpixel SP3 in addition to the second subpixel SP2.

After process P9, the second organic layer OR2, the second upper electrode UE2, the second cap layer CP2 and the second sealing layer SE2 are patterned (process P10). The flow of this patterning is similar to that of process P8. Process P10 allows the acquisition of the substrate shown in FIG. 19, in which the first display element DE1 and the first sealing layer SE1 are formed in the first subpixel SP1, and the second display element DE2 and the second sealing layer SE2 are formed in the second subpixel SP2, and neither a display element nor a sealing layer is formed in the third subpixel SP3.

After process P10, the third organic layer OR3 which is in contact with the third lower electrode LE3 through the third pixel aperture AP3, the third upper electrode UE3 which covers the third organic layer OR3 and the third cap layer CP3 which covers the third upper electrode UE3 are formed in order by vapor deposition. Further, the third sealing layer SE3 which continuously covers the third cap layer CP3 and the partition 6 is formed by CVD (process P11).

These third organic layer OR3, third upper electrode UE3, third cap layer CP3 and third sealing layer SE3 are formed in at least the entire display area DA and are provided in the first subpixel SP1 and the second subpixel SP2 in addition to the third subpixel SP3.

After process P11, the third organic layer OR3, the third upper electrode UE3, the third cap layer CP3 and the third sealing layer SE3 are patterned (process P12). The flow of this patterning is similar to that of process P8. Process P12 allows the acquisition of the substrate shown in FIG. 20, in which the first display element DE1 and the first sealing layer SE1 are formed in the first subpixel SP1, and the second display element DE2 and the second sealing layer SE2 are formed in the second subpixel SP2, and the third display element DE3 and the third sealing layer SE3 are formed in the third subpixel SP3.

After the display elements DE1, DE2 and DE3 and the sealing layers SE1, SE2 and SE3 are formed in the above matter, the resin layer 13, sealing layer 14 and resin layer 15 shown in FIG. 3 are formed in order (process P13). By this process, the display device DSP is completed.

In the embodiment described above, the rib 5 comprises the first rib layer 51 formed of the same first inorganic material as the sealing layers SE1, SE2 and SE3, and the second rib layer 52 formed of the second inorganic material different from the first inorganic material. If the rib 5 is entirely formed of the first inorganic material, there is a possibility that the rib 5 is partly damaged at the time of the dry etching of the first sealing layer SE1 shown in FIG. 16. For example, this damage could be caused when the rib 5 is not sufficiently covered with the first cap layer CP1 or the first upper electrode UE1 in subpixel SP2 or SP3 or when the etching corrodes a part of the first cap layer CP1 or the first upper electrode UE1 and the rib 5 is exposed. Similar problems could be caused at the time of the dry etching of the second sealing layer SE2 or the third sealing layer SE3. If the rib 5 is damaged, moisture may enter through such a portion, and the reliability of the display device DSP may be reduced.

When the second rib layer 52 formed of the second inorganic material is provided as the upper layer of the rib 5 like the present embodiment, it is possible to enhance the resistance of the rib 5 to the dry etching of the sealing layers SE1, SE2 and SE3 formed of the first inorganic material. This configuration prevents the damage to the rib 5, thereby improving the reliability of the display device DSP.

Silicon oxide and silicon oxynitride are inferior to silicon nitride in the covering property. Thus, when silicon oxide or silicon oxynitride is used as the first inorganic material, a void may be generated near the end portions of the lower electrodes LE1, LE2 and LE3 covered with the first rib layer 51 or near the partition 6 covered with the sealing layers SE1, SE2 and SE3.

To the contrary, silicon nitride is excellent in the covering property compared to silicon oxide and silicon oxynitride. Therefore, when silicon nitride is used as the first inorganic material, the end portions of the lower electrodes LE1, LE2 and LE3 are satisfactorily covered with the first rib layer 51. Further, the display elements DE1, DE2 and DE3 and the partition 6 are satisfactorily covered with the sealing layers SE1, SE2 and SE3. In this way, the moisture resistance of the display device DSP can be enhanced. Moreover, when silicon nitride is used as the first inorganic material, and silicon oxide or silicon oxynitride is used as the second inorganic material, it is possible to obtain a good etching selective ratio of the sealing layers SE1, SE2 and SE3 and the second rib layer 52 in the dry etching for the sealing layers SE1, SE2 and SE3.

The first rib layer 51 formed of silicon nitride should be preferably thick to satisfactorily cover the end portions of the lower electrodes LE1, LE2 and LE3. The etching rate of the second rib layer 52 formed of silicon oxide or silicon oxynitride is slower than that of the first rib layer 51. Therefore, if the second rib layer 52 is formed so as be thick, the time required for the patterning shown in FIG. 10 is increased. For this reason, as explained with reference to FIG. 4, the thickness T2 of the second rib layer 52 should be preferably less than the thickness T1 of the first rib layer 51. This configuration enables both the improvement of the resistance of the rib 5 to the dry etching of the sealing layers SE1, SE2 and SE3 and the shortening of the patterning time of the rib 5.

In addition, when the rib 5 is entirely too thick, the patterning time of the rib 5 is increased. Thus, as explained with reference to FIG. 4, the thickness T0 of the rib 5 should be preferably less than the height H of the partition 6. When thickness T0 is greater than or equal to 1.5 times the thickness T3 of the lower electrodes LE1, LE2 and LE3 and less than or equal to 5 times thickness T3, this configuration is advantageous in terms of both the patterning time of the rib 5 and the covering property of the lower electrodes LE1, LE2 and LE3 by the rib 5.

Various desirable effects can be obtained from the present embodiment in addition to the examples shown here.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib comprising a pixel aperture which overlaps the lower electrode;

a partition comprising a lower portion provided on the rib and an upper portion which protrudes from a side surface of the lower portion;
an upper electrode which faces the lower electrode;
an organic layer which is located between the lower electrode and the upper electrode, is in contact with the lower electrode through the pixel aperture, and emits light based on a potential difference between the lower electrode and the upper electrode; and
a sealing layer which continuously covers a display element including the lower electrode, the upper electrode and the organic layer and the partition, wherein
the rib includes a first rib layer and a second rib layer which covers the first rib layer,
the sealing layer and the first rib layer are formed of a first inorganic material,
the second rib layer is formed of a second inorganic material different from the first inorganic material, and
the second inorganic material is silicon oxynitride.

2. The display device of claim 1, wherein the first inorganic material is silicon nitride.

3. The display device of claim 1, wherein a thickness of the rib is less than a height of the partition.

4. The display device of claim 1, wherein a thickness of the rib is greater than or equal to 1.5 times a thickness of the lower electrode and less than or equal to 5 times the thickness of the lower electrode.

5. The display device of claim 1, wherein a thickness of the rib is greater than or equal to 200 nm and less than or equal to 600 nm.

6. The display device of claim 5, wherein a thickness of the second rib layer is greater than or equal to 50 nm and less than or equal to 100 nm.

7. The display device of claim 1, wherein the display element further comprises a cap layer which covers the upper electrode.

8. A manufacturing method of a display device, including:
forming a lower electrode;
forming a first rib layer which covers the lower electrode by a first inorganic material;
forming a second rib layer which covers the first rib layer by a second inorganic material different from the first inorganic material;
forming a rib comprising a pixel aperture which overlaps the lower electrode by patterning the first rib layer and the second rib layer;
forming a partition comprising a lower portion provided on the rib and an upper portion which protrudes from a side surface of the lower portion;
forming an organic layer which is in contact with the lower electrode through the pixel aperture;
forming an upper electrode which covers the organic layer; and
forming a sealing layer which covers a display element including the lower electrode, the upper electrode and the organic layer by the first inorganic material, wherein
the second inorganic material is silicon oxynitride.

9. The manufacturing method of claim 8, wherein the first inorganic material is silicon nitride.

10. The manufacturing method of claim 8, further including:
forming a resist on the sealing layer; and
removing a part of the sealing layer located above the partition by a dry etching using the resist as a mask.

11. The manufacturing method of claim 10, further including removing a part of the organic layer and a part of the upper electrode by an etching using the resist as a mask.

12. The manufacturing method of claim 8, wherein a thickness of the rib is less than a height of the partition.

13. The manufacturing method of claim 8, wherein a thickness of the rib is greater than or equal to 1.5 times a thickness of the lower electrode and less than or equal to 5 times the thickness of the lower electrode.

14. The manufacturing method of claim 8, wherein a thickness of the rib is greater than or equal to 200 nm and less than or equal to 600 nm.

15. The manufacturing method of claim 8, wherein a thickness of the second rib layer is greater than or equal to 50 nm and less than or equal to 100 nm.

16. The manufacturing method of claim 8, further including forming a cap layer which covers the upper electrode before forming the sealing layer.

17. A display device comprising:

a lower electrode;

a rib comprising a pixel aperture which overlaps the lower electrode;

a partition comprising a lower portion provided on the rib and an upper portion which protrudes from a side surface of the lower portion;

an upper electrode which faces the lower electrode;

an organic layer which is located between the lower electrode and the upper electrode, is in contact with the lower electrode through the pixel aperture, and emits light based on a potential difference between the lower electrode and the upper electrode; and a sealing layer which continuously covers a display element including the lower electrode, the upper electrode and the organic layer and the partition, wherein the rib includes a first rib layer and a second rib layer which covers the first rib layer, the sealing layer and the first rib layer are formed of a first inorganic insulating material, and the second rib layer is formed of a second inorganic insulating material different from the first inorganic insulating material.

18. The display device of claim 17, wherein the first rib layer includes a lower surface in direct contact with the lower electrode, an upper surface opposing the lower surface, and a side surface connecting the lower surface to the upper surface, and the second rib layer includes a lower surface in direct contact with the upper surface of the first rib layer and covering an entirety of the upper surface of the first rib layer, and an upper surface opposing the lower surface of the second rib layer and in direct contact with the lower portion of the partition.

19. The display device of claim 18, wherein the lower portion of the partition includes a first metal layer formed of a first metal material, and a second metal layer disposed on the first metal layer and formed of a second metal material, and a thickness of the second metal layer is greater than a thickness of the first metal layer.

20. The display device of claim 19, wherein the first metal material is different from the second metal material.

* * * * *